United States Patent [19]

Nair

[11] 4,416,932
[45] Nov. 22, 1983

[54] THICK FILM CONDUCTOR COMPOSITIONS

[75] Inventor: Kumaran M. Nair, East Amherst, N.Y.

[73] Assignee: E. I. Du Pont de Nemours and Company, Wilmington, Del.

[21] Appl. No.: 425,048

[22] Filed: Sep. 27, 1982

Related U.S. Application Data

[62] Division of Ser. No. 289,113, Aug. 3, 1981, Pat. No. 4,381,945.

[51] Int. Cl.$^3$ .......................... B32B 3/10; B32B 5/16; B05D 5/12
[52] U.S. Cl. ..................................... 428/209; 427/58; 427/63; 427/126.2; 427/126.5; 427/261; 427/266; 428/210; 428/323; 428/325; 428/469
[58] Field of Search ............... 428/209, 210, 323, 469; 427/126.2, 126.5, 266, 261, 58, 63, 248.1; 106/1.14; 252/512

[56] References Cited

U.S. PATENT DOCUMENTS

| | | | |
|---|---|---|---|
| 3,854,957 | 12/1974 | Larry | 106/1.14 |
| 4,187,201 | 2/1980 | Hilson et al. | 252/512 |
| 4,381,945 | 5/1983 | Nair | 106/1.014 |

FOREIGN PATENT DOCUMENTS

| | | | |
|---|---|---|---|
| 33979 | 8/1981 | European Pat. Off. | 106/1.14 |
| 2046385 | 3/1972 | Fed. Rep. of Germany | 106/1.14 |
| 772675 | 4/1957 | United Kingdom | 427/248.1 |

OTHER PUBLICATIONS

Ken-React Bulletin No. KR-027807 Rev., "Titanate Coupling Agents for Filled Polymers", pp. ARM 1-49, Feb. 1978.

Du Pont Bulletin No. E38961, "Physical and Chemical Properties", pp. 4-7, 37, 38, 45, Dec. 1980.

Primary Examiner—Thomas J. Herbert, Jr.

[57] ABSTRACT

A ceramic substrate having a conductive pattern coating thereon wherein the coating comprises an admixture of finely divided particles of a noble metal or alloy, a low melting low viscosity glass, a spinel-forming metal oxide and an organo titanate and the process of making same.

6 Claims, No Drawings

THICK FILM CONDUCTOR COMPOSITIONS

This is a division, of application Ser. No. 289,113, filed Aug. 3, 1981, now U.S. Pat. No. 4,381,945.

FIELD OF THE INVENTION

The invention relates to thick film electrode compositions and especially to such compositions which are useful as terminations for hermetic ceramic capacitors.

BACKGROUND OF THE INVENTION

Thick film conductors serve as electrical interconnections between resistors, capacitors and integrated circuits. Thick film conductors are used in the microcircuit industry to "terminate" resistor or capacitor patterns, typically by firing the conductor pattern on a substrate and then printing the resistor or capacitor pattern over part of the conductor pattern and then firing them both.

Similarly to other thick film materials, thick film conductors are comprised of an active (conductive) metal and inorganic binder, both of which are in finely divided form and are dispersed in an organic vehicle. The conductive phase is ordinarily gold, palladium, silver, platinum or alloys thereof, the choice of which depends upon the particular performance characteristics which are sought, e.g., resistivity, solderability, solder leach resistance, migration resistance, bondability and the like.

Thick film techniques are contrasted with thin film techniques which involve deposition of particles by evaporation or sputtering. Thick film techniques are discussed in Handbook of Materials and Processes for Electronics, C. A. Harper, Editor, McGraw-Hill, N.Y., 1970, Chapter 12.

In addtion to the proper level of conductivity there are many secondary properties which must also be present such as good adhesion to both ceramic substrates and thick films, solderability and compatibility to other thick films little or no surface crystal growth and good capability of use in hermetic systems and little or no chemical interaction with overprinted thick film resistor or capacitor systems.

As would be expected, a most critical variable in the technology of thick film conductors for use as terminations is the adhesion of the two functional systems. Thus, there has been emphasis in the prior art on the addition of various adhesion promoters. Of particular importance in this regard has been the incorporation of titanium resonate (organic titanates) into thick film dielectric compositions to effect better adhesion both to the substrate and to the thick film terminations with which they are used. In this application relative adhesion is observed by the tenacity of the termination to peel away from the dielectric material after the system is fired.

BRIEF DESCRIPTION OF THE INVENTION

The invention is therefore directed to a novel noble metallization for use in the manufacture of printed conductors which has outstanding adhesion properties in this application. In particular the invention is directed to a noble metal metallization suitable for the manufacture of printed terminations, which is an admixture of A. 30 to 80% by weight finely divided particles of noble metal or alloy thereof, B. 1 to 20% by weight finely divided particles of low viscosity glass, C. 0.1 to 10% by weight inorganic metal oxide capable of reacting with $Al_2O_3$ to form a spinel structure, and D. 0.1 to 2% by weight organic titanate which is a source of positive titanium ions.

The above indicated functionality of the components being obtainable by firing the mixture to effect liquid phase sintering of the glass and metal.

In a further aspect the invention is directed to screen-printable paste comprising the above-described metallization dispersed in organic medium. Still further, the invention is directed to conductive elements comprising a nonconductive ceramic substrate having a conductive pattern affixed thereon formed by printing a pattern of the above-described screen printable paste and firing the printed substrate to effect volatilization of the organic medium and liquid phase sintering of the inorganic binder and metallization. In yet another aspect, the invention is directed to a process for making conductors comprising (a) applying a patterned thick film of the above-described screen printable paste to a nonconductive ceramic substrate, (b) drying the film at a temperature below 200° C. and (c) firing the dried film to effect liquid phase sintering of the inorganic binder and metallization.

DETAILED DESCRIPTION OF THE INVENTION

A. Conductive Material

The finely divided metals used in the invention can be any of those noble metal powders which are commercially available for use in thick film conductors. The particle size of the above-described metallic materials is not narrowly critical from the standpoint of their technical effectiveness in the invention. However, they should, of course, be of a size appropriate to the manner in which they are applied, which is usually screen printing, and to the firing conditions. Thus the metallic material should be no bigger than 10 μm and preferably should be below about 5 μm. As a practical matter, the available particle size of the metals is as low as 0.1 μm for palladium and from 0.1 to 10 μm for silver.

When Pd/Ag is used as the conductive metal, the ratio of the Pd/Ag metal powders can vary between 0.06 and 1.5, preferably, between 0.06 and 0.5. The metal powders can have either flake or nonflake morphology. The nonflake powders can be irregularly shaped or spherical. By flake morphology is meant a metal powder whose predominant shape is flake as determined by scanning electron microscopy. Such flake silvers have an average surface area of approximately 1 m²/g and solids content of approximately 99–100% by weight. Nonflake silver powders typically have an average surface area of 1–2 m²/g and solids content of approximately 99–100% by weight. Palladium metal powder has an average surface area of 5.0–15.0 m²/g, preferably, 7.0–11.0 m²/g and solids content of approximately 99–100% by weight. Platinum powder has a surface area of approximately 10 m²/g to 30 m²/g and a solids content of about 98–100% by weight. When used with Pd/Ag, platinum will ordinarily be used in amounts of from 0.1 to 5% by weight.

B. Inorganic Binder

The glass component of the conductor compositions of this invention is a, low-softening point, low viscosity glass at 1–20 parts by weight level and, preferably, at 5–15 parts level. As used herein, the term low-softening point glass is one having a softening point below 850° C. and, preferably, below 600° C. as measured by the fiber elongation method (ASTM-C338-57). The glass utilized in this invention must also have a low viscosity at the firing temperature to aid liquid phase sintering of inorganic particulates. A glass having a specific viscosity (log $\eta$) of less than 6 at the firing temperature which is capable of aiding liquid phase sintering and has "powder carrying" ability is particularly preferred. It is believed that the low softening point, low viscosity glass facilitates transfer of the metal oxide to the interface of the ceramic substrate and the thick film where it reacts with the substrate to form complex oxides. These structures markedly improve the adhesion of the thick film to the ceramic substrate. When $Al_2O_3$ is the substrate material, the oxides react with the alumina to form spinel structures which are mechanically quite strong.

It is not, strictly speaking, necessary that the glass used in the invention as inorganic binder be devitrifiable during the cooling phase of the firing cycle. However, it is preferred generally that the glass component of the invention also be devitrifiable and especially when it is to be used to terminate hermetic thick film capacitors.

Typical examples of glasses meeting the above critieria are lead germinate bismuth-free glasses containing, by weight, 50–80% $Pb_3O_4$ and 10–30% $GeO_2$. A particular preferred glass contains 78.5% $Pb_3O_4$ and 21.5% $GeO_2$.

The glasses are prepared by conventional glass-making techniques, by mixing the desired components in the desired proportions and heating the mixture to form a melt. As is well-known in the art, heating is conducted to a peak temperature and for a time such that the melt becomes entirely liquid and homogeneous. In the present work the components are premixed by shaking in a polyethylene jar with plastic balls and then melted in a platinum crucible at 825°–850° C. The melt is heated at the peak temperature for a period of 1½ hours. The melt is then poured into cold water. The maximum temperature of the water during quenching is kept as low as possible by increasing the volume of water to melt ratio. The crude frit after separation from water, is freed from residual water by drying in air or by displacing the water by rinsing with methanol. The crude frit is then ball-milled for 3–5 hours in alumina containers using alumina balls. Alumina picked up by the materials, if any, is not within the observable limit as measured by X-ray diffraction analysis.

After discharging the milled frit slurry from the mill, the excess solvent is removed by decantation and the frit powder is air-dried at room temperature. The dried powder is then screened through a 325 mesh screen to remove any large particles.

The major two properties of the frit are: it aids the liquid phase sintering of the inorganic crystalline particulate matters and forms noncrystalline (amorphous) or crystalline materials by devitrification during the heating-cooling cycle (firing cycle) in the preparation of thick film compositions. This devitrification process can yield either a single crystalline phase having the same composition as the precursor noncrystalline (glassy) material or multiple crystalline phases with different compositions from that of the precursor glassy material.

C. Metal Oxide

The metal oxides (MeO) which are suitable for the practice of the invention are those which are capable of reacting with $Al_2O_3$ to form a spinel structure when the composition of the invention is fired. ($MeAl_2O_4$) While the exact mechanism by which these metal oxides function is not known, it is believed that the metal oxides are transported through the glass phase to the ceramic substrate where they interact with the surface of the $Al_2O_3$ substrate to form a mechanically strong spinel structure.

Suitable inorganic oxides are those based upon $Zn^{2+}$, $Mg^{2+}$, $Co^{2+}$, $Ni^{2+}$, $Fe^{2+}$, and $Mn^{2+}$ ions. Precursors of the metal oxides such as carbonates and oxylates which will decompose under firing conditions to form the corresponding metal oxides may be used with comparable effectiveness.

The particle size of the metal oxides or precursors should be of a size appropriate to the manner in which the composition of the invention is applied, which is usually by screen printing. thus the particle size should be no larger than about 15 $\mu$m and preferably should be below about 5 $\mu$m.

D. Organotitanate

The organotitanate component of the invention is essential to provide a source of positive titanium ions. This organometallic component is believed to decompose into various oxides of titanium during firing of the composition which oxides are then dispersed throughout the system. These oxides appear to function as adhesion agents by interaction with the overlying functional phase of the resistor or capacitor with which they are used.

Suitable organotitanates are those disclosed in U.K. Pat. No. 772,675 and particularly those in which the organotitanates is an hydrolyzable metal alcoholate of titanium corresponding to the formula $(AO)_{4x-2y}TiO_y$, in which A is $C_{1-8}$ alkyl or a mixture of $C_{1-8}$ alkyl and $C_{1-8}$ acyl, O is an oxygen atom covalently bonding two titanium atoms, x is an integer from 1 to 12 and y is O or an integer from 1 to $3\times/2$. The alkyl groups may be either straight chain or branched. Preferred organotitanates include titanium acetyl acetonate and tetraoctylene glycol titanium chelate. Other organotitanates of this type are disclosed in Ken-React Bul. No. KR-0278-7 Rev. (Kenrich Petrochemicals, Inc., Bayonne, N.J.) and in Du Pont Bul. No. E-38961 entitled Versatile Tyzor Organic Titanates.

E. Organic Medium

The inorganic particles are mixed with an inert liquid medium (vehicle) by mechanical mixing (e.g., on a roll mill) to form a paste-like composition having suitable consistency and rheology for screen printing. The latter is printed as a "thick film" on conventional ceramic substrates in the conventional manner. Any inert liquid may be used as the vehicle. Various organic liquids, with or without thickening and/or stabilizing agents and/or other common additives, may be used as the vehicle. Exemplary of organic liquids which can be used are the aliphatic alcohols, esters of such alcohols, for example, acetates and propionates, terpenes such as pine oil, terpineol and the like, solutions of resins such as the polymethacrylates of lower alcohols, and solutions of ethyl cellulose in solvents such as pine oil, and the monobutyl ether of ethylene glycol monoacetate. The vehicle may contain volatile liquids to promote fast setting after application to the substrate.

The ratio of vehicle to solids in the dispersions can vary considerably and depends upon the manner in which the dispersion is to be applied and the kind of vehicle used. Normally to achieve good coverage the dispersions will contain complementally, 60-90% solids and 40-10% vehicle. The compositions of the present invention may, of course, be modified by the addition of other materials which do not affect its beneficial characteristics. Such formulation is well within the skill of the art.

Formulation and Application

In the preparation of the composition of the present invention, the particulate inorganic solids are mixed with the organic carrier and dispersed with suitable equipment, such as a three-roll mill, to form a suspension, resulting in a composition for which the viscosity will be in the range of about 100-150 pascal-seconds at a shear rate of 4 $sec^{-1}$.

In the examples which follow, the formulation was carried out in the following manner:

The ingredients of the paste, minus about 5% of the organic components, are weighed together in a container. The components are then vigorously mixed to form a uniform blend; then the blend is passed through dispersing equipment, such as a three roll mill, to achieve a good dispersion of particles. A Hegman gauge is used to determine the state of dispersion of the particles in the paste. This instrument consists of a channel in a block of steel that is 25 $\mu$m deep (1 mil) on one end and ramps up to 0" depth at the other end. A blade is used to draw down paste along the length of the channel. Scratches will appear in the channel where agglomerates' diameter is greater than the channel depth. A satisfactory dispersion will give a fourth scratch point of 10-18 $\mu$m typically. The point at which half of the channel is uncovered with a well dispersed paste is between 3 and 8 $\mu$m typically. Fourth scratch measurement of >20 $\mu$m and "half-channel" measurements of >10 $\mu$m indicate a poorly dispersed suspension.

The remaining 5% consisting of organic components of the paste is then added, and the resin content is adjusted to bring the viscosity when fully formulated to between 100 and 150 Pa.s., typically.

The composition is then applied to a substrate, such as alumina ceramic, usually by the process of screen printing, to a wet thickness of about 10-30 microns and preferably 15-20 microns. The printed pattern is then dried at about 80°-150° C. for about 5-15 minutes. Firing to effect sintering of the inorganic binder as well as the finely divided particles of metal is preferably done in a well ventilated belt conveyor furnace with a temperature profile that will allow burnout of the organic matter at about 300°-600° C., a period of maximum temperature of about 800°-950° C. lasting about 5-15 minutes, followed by a controlled cooldown cycle to prevent over-sintering, unwanted chemical reactions at intermediate temperatures, or substrate fracture from too rapid cooldown. The overall firing procedure will preferably extend over a period of about 1 hour, with 20-25 minutes to reach the firing temperature, about 10 minutes at the firing temperature, and about 20-25 minutes in cooldown.

The fired thickness of the conductor can range from about 6 to about 15 microns, depending on the percent solids, the type of screen the composition is printed with, the printer setup, and the degree of sintering of the inorganic solids.

The electrode compositions of this invention can be printed as film onto the substrates, or onto other thick films either by using an automated printer or a hand printer in the conventional manner. Preferably, automatic screen stenciling techniques are employed, using a 200 to 325 mesh screen.

B. Definitions and Test Procedures

1. Solder Adhesion Test

The solder-adhesion properties of the electrode composition of the invention are evaluated as follows:

a. The electrode composition is printed using an automatic printer and 200 mesh adhesion pattern screen, dried at elevated temperatures such as 125° C. for approximately 15 minutes and fired in air in a belt furnace at a peak temperature of 850° C. for 10 minutes;

b. Tin coated copper lead wires are placed over the pattern and dipped in Sn/Pb/Ag or Sn/Pb solder;

C. Initial solder-adhesion pull values are determined using an Instron ® instrument at a pull rate of 20 inches per minute. The force in pounds (lbs) required to pull out the wires is taken as the measure of adhesion.

d. The above-described electrode adhesion patterns printed onto alumina substrates are soldered and stored at 100°-150° C. in an oven for various periods of time, prior to the determination of aged adhesion values.

2. Dielectric Constant (K)

Dielectric constant is a measure of the ability of a dielectric material to store an electrical potential under the influence of an electrical field. Thus the ratio between the capacitance of a capacitor using the material as dielectric (ceramic in this case) to the capacitance with a vacuum as the dielectric.

3. Dielectric Material

Dielectric material is a nonconducting material or insulator that separates electrical charges and can result in the storage of an electrical charge.

4. Dissipation Factor (DF)

Dissipation factor is a measure of internal losses due to conduction through the dielectric from one lead to the other. This power loss results in the thermal dissipation of electrical energy which is undesirable because it raises the temperature of the device.

Capacitance and dissipation factors are measured using a Hewlett-Packard HP4274A multi-frequency LCR meter, while insulation resistance is measured using Super megohm meter Model RM 170 (Biddle Instruments, AV0, Ltd., U.K.) Insulation resistance measurements are made after charging the capacitor with 100 VDC. Each number is the average of at least 10 measurements. The thickness of the dielectric layer is measured using Gould Surfanalyzer 150/recorder 250. The dielectric constant is calculated using the equation:

$$K = (C/A) \cdot t$$

where C is the capacitance of the capacitor

A—is the area of small electrode in contact with the dielectric layer t—is the thickness of the dielectric layer.

All capacitors were aged for at least 15 hours after firing before making the electrical measurements. It is common that the dissipation factor (DF) decreases by 0.5-2% within this aging time period. However, the capacitance is generally unaffected during this period.

Effect of repeated firing of the conductor on adhesion was also determined. The conductors were prited either on alumina substrates or other ceramic substrates or thick film base and fired repeatedly. Evaluation of the multi-fired conductors is then carried out in the manner described immediately above.

EXAMPLES

The invention will be fully understood by reference to the following examples.

Examples 1-4

A series of four compositions in accordance with the invention was prepared which differed essentially only in the amount of low-melting, low-viscosity glass used as the inorganic binder phase. Each of the conductor formulations was then tested for solder adhesion both with 62/36/2 Sn/Pb/Ag solder and 10/90 Sn/Pb solder. The formulation and test results are given in Table 1 which follows:

TABLE 1

Effect of Binder Content on Solder Adhesion

| Example No. | 1 | 2 | 3 | 4 |
|---|---|---|---|---|
| Formulation, % Wt. | | | | |
| Platinum Powder | 9 | 9 | 9 | 9 |
| Palladium Powder | 4 | 4 | 4 | 4 |
| Silver Powder | 49.1 | 49.1 | 49.1 | 49.1 |
| Pb$_5$Ge$_3$O$_{11}$ | 13.9 | 11.9 | 8.9 | 6.9 |
| Zinc Oxide | 2 | 2 | 2 | 2 |
| Titanium Resinate | 1 | 1 | 1 | 1 |
| Organic Medium | Balance | Balance | Balance | Balance |
| Solder-Adhesion (1b) (62-36-2 Sn/Pb/Ag Solder) | | | | |
| Initial (Single fired on alumina) | 6.6 | 7.3 | 6.6 | 3.2 |
| Aged at 150° C. for 48 hours | 5.9 | 6.2 | 5.9 | 2.8 |
| Initial (Fired 5 times on alumina) | 5.9 | 6.0 | 5.4 | 3.2 |
| Aged at 150° C. for 48 hours | 6.1 | 6.1 | 5.6 | 3.5 |
| Initial (Single fired on thick films) | 6.5 | 6.7 | 6.3 | 4.0 |
| Aged at 150° C. for 48 hours | 4.7 | 4.5 | 4.0 | 2.4 |
| Initial (Twice fired on thick film) | 6.1 | 5.7 | 5.6 | 5.6 |
| Aged at 150° C. for 48 hours | 3.9 | 4.2 | 4.5 | 3.2 |
| Solder-Adhesion (1b) (10-90 Sn/Pb Solder) | | | | |
| Initial (Single fired on alumina) | 5.1 | 5.1 | 5.3 | 4.8 |
| Aged at 150° C. for 48 hours | 5.9 | 5.5 | 5.7 | 5.1 |
| Initial (Fired 5 times on alumina | 4.5 | 5.1 | 4.7 | 5.1 |
| Aged at 150° C. for 48 hours | 4.5 | 4.5 | 4.4 | 4.8 |
| Initial (Single fired as thick films) | 4.8 | 4.8 | 5.6 | 3.4 |
| Aged at 150° C. for 48 hours | 4.3 | 4.7 | 5.2 | 4.0 |
| Initial (Twice fired on thick films) | 3.5 | 4.3 | 4.5 | 4.0 |
| Aged at 150° C. for 48 hours | 4.3 | 4.4 | 4.7 | 4.7 |

TABLE 1-continued

Effect of Binder Content on Solder Adhesion

| Example No. | 1 | 2 | 3 | 4 |
|---|---|---|---|---|
| hours | | | | |

Each of the above-described conductors exhibited quite good solder adhesion in that relatively little decrease in adhesion resulted from aging and repeated firing.

Examples 5-8

A series of four conventional prior art conductor compositions was prepared which contained neither a spinel-forming oxide nor a source of titanium ions. The glass frit used as the binder phase was a conventional low-melting bismuth-containing glass having the following composition:

| | |
|---|---|
| Bi$_2$O$_3$ | 75.1% wt. |
| PbO | 10.9 |
| SiO$_2$ | 9.3 |
| CaO | 2.4 |
| B$_2$O$_3$ | 1.2 |
| Al$_2$O$_3$ | 1.1 |
| | 100.0 |

TABLE 2

Solder Adhesion of Conventional Prior Art Conductors

| Example No. | 5 | 6 | 7 | 8 |
|---|---|---|---|---|
| Formulation, % Wt. | 63/36/2 | Sn/Pb/Ag | 10-90 | Sn/Pb |
| Platinum Powder | 9 | 2 | 9 | 2 |
| Palladium Powder | 4 | 16 | 4 | 16 |
| Silver Powder | 50 | 45 | 50 | 45 |
| Glass frit | 10 | 10 | 10 | 10 |
| Organic Medium | Balance | Balance | Balance | Balance |
| Solder-Adhesion (1b) | | | | |
| Initial (Single fired on alumina) | 6.2 | 6.7 | 5.5 | 5.8 |
| Aged at 150° C. for 48 hours | 4.7 | 2.9 | 5.1 | 6.0 |
| Initial (Fired 5 times on alumina) | 5.9 | 6.6 | 5.3 | 4.8 |
| Aged at 150° C. for 48 hours | 3.2 | 2.7 | 4.8 | 4.6 |
| Initial (Single fired on thick films) | 6.5 | 5.5 | 4.4 | 4.8 |
| Aged at 150° C. for 48 hours | 1.6 | 1.1 | 4.4 | 4.3 |
| Initial (Twice fired on thick film) | 6.1 | 4.6 | 3.5 | 4.0 |
| Aged at 150° C. for 48 hours | 2.0 | 2.4 | 4.4 | 4.3 |

Comparison of the data in Tables 1 and 2 reveals that the aged solder-adhesion values of the invention compositions are superior over the prior art compositions with both types of solder.

Examples 9 and 10

Two different invention compositions and two commercial Pd/Ag electrode compositions containing bismuth glass were formulated as described above and evaluated as terminations for two different commercial thick film printed capacitors. These test elements were prepared as follows:
1. The below-described electrode composition was printed using an automatic printer, dried at 120° C. for approximately 15 minutes and fired in air in a belt furnace at a peak temperature in approximately 825°–925° l C. for 10 minutes, with a total firing cycle of 1–1.5 hours. The fired thickness was 10–14 μm, as measured by a Surfanalyzer;

2. One layer of a dielectric composition was printed over the electrode film using a double wet pass with the squeegee and dried at 125° C. for approximately 15 minutes;

3. A second layer of the dielectric composition was printed over that of the first layer and it also was dried at 125° C. for 15 minutes;

4. Finally, the electrode composition was printed on the top of the dielectric layer, and dried at 125° C. for approximately 15 minutes. The two dielectric layers and the top electrode were then fired in air in a belt furnace at a peak temperature of approximately 825°–950° C. for 10 minutes, the total firing cycle being 1–1.5 hours. The fired thickness of the two dielectric layers together was 30–60 μm as measured in a Surfanalyzer.

TABLE 3

| Example No. | Solderability | |
|---|---|---|
| | 9 | 10 |
| Electrode Formulation | | |
| Palladium Powder | 17.8% wt. | 17.8% wt. |
| Silver Powder | 44.3 | 44.3 |
| $Pb_5Ge_3O_{11}$ glass | 15.9 | 13.9 |
| ZnO | — | 2 |
| Organic titanate[1] | — | 1 |
| Vehicle | Balance | Balance |

[1]Tyzor ® AA, tradename for branched $C_8$ acetyl acetonate chelate organic titanate sold by E. I. du Pont de Nemours and Company, Wilmington, DE 19898.

The solderability of the Example 10 conductor, as shown by repeated dipping in solder, was excellent whereas the Example 9 material, which contained no organic titanate, exhibited poor solderability by the same test as indicated by discontinuities in the solder caused by leaching out of silver from the conductor composition.

TABLE 4

| Example No. | Capacitor Compatibility | | | |
|---|---|---|---|---|
| | 9 | 10 | Commercial I | Commercial II |
| Dielectric Constant, K | 450 | 623 | 491 | 423 |
| Dissipation Factor, % | <1.5 | <1.5 | <3.4 | <3.0 |
| Insulation Resistance, Ω (at 100 volts) | >$10^{10}$ | >$10^{10}$ | >$10^8$ | >$10^8$ |

The foregoing data show that the commercial electrodes had undesirably high DF values and relatively low IR even at normal room conditions.

I claim:

1. A conductive element comprising a nonconductive ceramic substrate having a conductive pattern affixed thereon by
   (a) printing thereon a patterned film of a screen-printable paste which is a dispersion in organic medium of a metallization comprising an admixture of finely divided particles of
      (1) 30–80% by weight noble metal or alloy thereof,
      (2) 1–20% by weight low melting, low viscosity glass,
      (3) 0.1–10% by weight inorganic metal oxide capable of reacting with $Al_2O_3$ under firing conditions to form a spinel structure, and
      (4) organotitanate which is a source of positive titanium ions under firing conditions,
   (b) drying, and
   (c) firing the dried film to effect volatilization of the organic medium and liquid phase sintering of the glass.

2. A process for making conductors comprising
   (a) applying to a nonconductive substrate a patterned thick film of a screen-printable paste which is a dispersion in organic medium of a metallization comprising an admixture of finely divided particles of
      (1) 30–80% by weight noble metal or alloy thereof,
      (2) 1–20% by weight low melting, low viscosity glass,
      (3) 0.1–10% by weight inorganic metal oxide capable of reacting with $Al_2O_3$ under firing conditions to form a spinel structure, and
      (4) an organotitanate which is a source of positive titanium ions under firing conditions,
   (b) drying the film, and
   (c) firing the dried film to effect volatilization of the organic medium and liquid phase sintering of the glass and noble metal or noble metal alloy.

3. The process of claim 2 in which the noble metal component of the metallization is an admixture of palladium and silver particles in a weight ratio of 0.06 to 1.5 Pd/Ag.

4. The process of claim 2 in which the glass is a bismuth-free lead germanate glass containing 50–80% wt. $Pb_3O_4$ and 10–30% wt. $GeO_2$.

5. The process of claim 2 in which the spinel-forming component is an oxide or oxide precursor of a divalent metal selected from the group consisting of Zn, Mg, Co, Ni, Fe, and Mn.

6. The process of claim 2 in which the organotitanate is an hydrolyzable metal alcoholate of titanium corresponding to the formula $(AO)_{4x-2y}TiO_y$, in which A is $C_{1-8}$ alkyl or a mixture of $C_{1-8}$ alkyl and $C_{1-8}$ acyl, O is an oxygen atom covalently bonded to two titanium atoms, x is an interger of 1 to 12, and y is O or an interger from 1 to $3 \times /2$.

* * * * *